US012810916B2

(12) United States Patent
Lu et al.

(10) Patent No.: US 12,810,916 B2
(45) Date of Patent: Nov. 24, 2026

(54) USAGE-BASED DISTURBANCE COUNTER CLEARANCE

(71) Applicant: Micron Technology, Inc., Boise, ID (US)

(72) Inventors: Yang Lu, Boise, ID (US); Mark Kalei Hadrick, Boise, ID (US); HyunYoo Lee, Boise, ID (US); KeunSoo Song, Meridian, ID (US); John Christopher Sancon, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 18/628,127

(22) Filed: Apr. 5, 2024

(65) Prior Publication Data

US 2024/0347096 A1 Oct. 17, 2024

Related U.S. Application Data

(60) Provisional application No. 63/495,420, filed on Apr. 11, 2023.

(51) Int. Cl.
*G11C 11/406* (2006.01)
*G11C 11/4096* (2006.01)

(52) U.S. Cl.
CPC ... *G11C 11/40615* (2013.01); *G11C 11/40611* (2013.01); *G11C 11/4096* (2013.01)

(58) Field of Classification Search
CPC .................... G11C 11/40615; G11C 11/40611
USPC .......................................................... 365/222
See application file for complete search history.

(56) References Cited

U.S. PATENT DOCUMENTS

2020/0251158 A1* 8/2020 Shore .................... G11C 11/408
2024/0012755 A1* 1/2024 Hyun .................. G06F 12/1416
2024/0119985 A1* 4/2024 Benedict ........... G11C 11/40615

* cited by examiner

*Primary Examiner* — Anthan Tran
(74) *Attorney, Agent, or Firm* — Colby Nipper PLLC

(57) ABSTRACT

Apparatuses and techniques for implementing usage-based disturbance counter clearance are described. In example implementations, a memory device includes a memory array having multiple rows. The memory device also includes multiple usage-based disturbance counters that are associated with the memory array. The memory device further includes logic that performs a refresh operation on a row of the multiple rows responsive to a refresh command. The logic also clears a usage-based disturbance counter of the multiple usage-based disturbance counters responsive to the refresh command. Here, the usage-based disturbance counter stores a quantity of accesses to the row of the multiple rows. This can reduce a frequency of performing usage-based disturbance mitigation procedures that would otherwise be applied to the multiple usage-based disturbance counters, thereby saving power and avoiding denial-of-service periods with the memory array.

20 Claims, 9 Drawing Sheets

USAGE-BASED DISTURBANCE COUNTER CLEARANCE

CROSS-REFERENCE TO RELATED APPLICATION(S)

This application claims the benefit of U.S. Provisional Patent Application No. 63/495,420 filed on Apr. 11, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for implementing usage-based disturbance counter clearance are described with reference to the following drawings. The same numbers are used throughout the drawings to reference like features and components.

DETAILED DESCRIPTION

Overview

Figure 1:
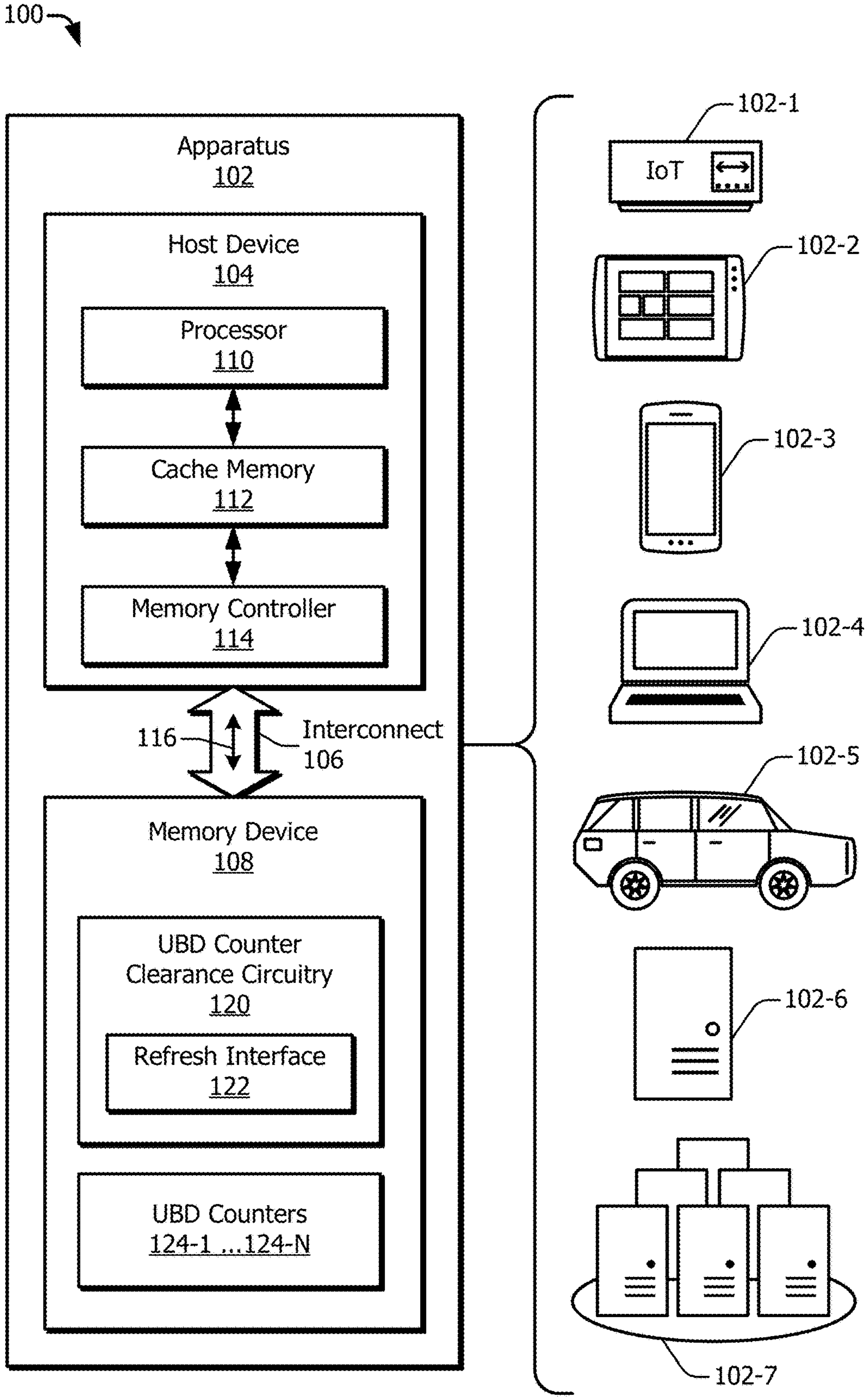
FIG. 1 illustrates example apparatuses that can implement aspects of usage-based disturbance counter clearance.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller or more power-efficient memories, memory devices can be designed with higher chip densities where components, which may also be increasingly smaller, are placed closer together on a chip. Increasing chip density, however, can increase the electromagnetic coupling (e.g., capacitive coupling) between adjacent or proximate rows of memory cells due at least partly to a shrinking distance between these rows. With this undesired coupling, activation (or charging) of a first row of memory cells can sometimes negatively impact a second nearby row of memory cells.

In particular, activation of the first row can generate interference, or crosstalk, that causes the second or affected row to experience a voltage fluctuation. In some instances, this voltage fluctuation can cause a state (or value) of a memory cell in the second row to be incorrectly determined by a sense amplifier. Consider an example in which a state of a memory cell in the second row is a "1" based on a voltage that is initially stored therein. In this example, the voltage fluctuation can cause a sense amplifier to incorrectly determine the state of the memory cell to be a "0" instead of a "1" based on a change to the stored voltage. Left unchecked, this interference can lead to memory errors or data loss within the memory device.

In some circumstances, a particular row of memory cells is activated repeatedly in an unintentional or intentional (sometimes even malicious) manner. Consider, for instance, that memory cells in an $R^{th}$ row are subjected to repeated activation. This can cause one or more memory cells in an adjacent row or a proximate row (e.g., within an R+1 row, an R+2 row, an R−1 row, and/or an R−2 row) to change states. This effect is referred to herein as a usage-based disturbance (UBD). The occurrence of usage-based disturbances can lead to the corruption or changing of contents within an affected row of memory.

Some memory devices utilize circuits that can detect usage-based disturbance and mitigate its effects. For example, a memory device may include multiple usage-based disturbance counters. Each usage-based disturbance counter can correspond to a row of a memory array. The usage-based disturbance counter keeps track of a quantity of accesses or activations of the corresponding row. For instance, the circuitry can increment the tracked quantity in the usage-based disturbance counter responsive to each activation of the corresponding memory row. If the tracked quantity in the counter reaches a threshold value, proximate rows, including adjacent rows, may be at increased risk for data corruption due to the repeated activations of the accessed row. To mitigate this risk to affected rows, circuitry can compare the quantity stored in the usage-based disturbance counter to at least one threshold value.

If the quantity violates the threshold value (e.g., if the quantity meets or exceeds the threshold value), the circuitry can perform an activation on one or more of the affected rows that are proximate to the activated row. By activating the affected rows, the "correct" voltages stored in the memory cells are reinstated to a "full" level. Thus, if the proximate rows are activated before a state of any memory cells are changed due to the usage-based disturbance effect, the correct states can be maintained even under repeated accesses to the activated row.

Once one or more proximate rows have been activated to reinstate the correct voltage level, or memory state value, the circuitry can clear the stored value in the usage-based disturbance counter that corresponds to the activated row. Thus, the count value can start being incremented again. Meanwhile, the values stored in other usage-based disturbance counters may be continuing to increase responsive to each activation of the corresponding memory row. This increasing of the values may continue until a respective value in each counter violates the threshold, at which time a mitigation procedure may be performed to activate affected proximate rows and to clear the corresponding usage-based disturbance counters.

In some approaches, the quantities in the multiple usage-based disturbance counters can increase until the mitigation procedure is performed. Generally, this provides a desired protective feature: reducing the probability that the repeated activations that cause the usage-based disturbance effect can corrupt data. Performing the mitigation procedure, however, has costs. First, the procedure incurs an energy cost as electrons are moved around the circuitry to activate one or more rows and clear the corresponding one or more counters. Second, the mitigation procedure takes some amount of time during which the affected rows, and potentially other rows that share the same access circuitry, are unavailable. As the number of usage-based disturbance counters that simultaneously approach the threshold increases, this period of unavailability can be sufficiently long so as to negatively impact memory performance by delaying or otherwise slowing responses to memory access requests.

To address these and other issues regarding usage-based disturbances, this document describes aspects of usage-based disturbance counter clearance. As part of the mitigation procedure described above, mitigation circuitry activates affected rows for the purpose of returning or reinstating the correct memory states to their "full" corresponding voltage levels. With memory refresh operations, as described below, the correct states of memory cells in a given row are also returned to their "full" corresponding voltage levels. With dynamic random-access memory (DRAM), a voltage level, which corresponds to a data value, for each memory cell can be stored in a capacitor that is accessed via at least one respective transistor. The charge stored in the capacitor, however, "leaks" over time such that the correct voltage level may change to an incorrect voltage level, which changes the data value. A procedure to address this issue is called a memory refresh operation.

The charge leakage from each capacitor can generally have a known or predicted rate. Accordingly, the memory device can repeatedly refresh (e.g., periodically refresh) the charges in each capacitor sufficiently frequently to counteract this rate of discharge at the capacitors. During a refresh operation, sense amplifiers read out data from a row of memory and then write the data back to the row at a "full" charge level, or at least to a voltage range that qualifies as correct charge level. Thus, even if a memory row that is being refreshed is a row that is potentially affected by repeated activations of a proximate row, the refreshed memory row is no longer in near-term danger after the memory refresh of data corruption due to the usage-based disturbance effect.

To synergistically utilize the charge restoration result of memory refreshing, example implementations that are described herein can manipulate the multiple usage-based disturbance counters in conjunction with memory refresh operations. For example, responsive to a memory row being refreshed, usage-based disturbance circuitry can clear a usage-based disturbance counter corresponding to the memory row. Because maximum refresh intervals are specified and the order of rows being refreshed can be determined, the memory device, or a designer thereof, can ensure that rows that are proximate to the refreshed row have been or will be refreshed before the counter could have reached a mitigation threshold value.

These refresh-based counter clearance techniques increase power efficiency by avoiding or at least delaying a next mitigation procedure on a refreshed memory row because the refreshed row has its corresponding usage-based disturbance counter cleared in conjunction with the refresh operation. These techniques can also reduce the occurrence of denial-of-service waiting periods due to a backlog of usage-based disturbance counters that would otherwise be queued for a mitigation procedure. These and other implementations are described herein.

Example Operating Environments

FIG. 1 illustrates, at 100 generally, an example operating environment including an apparatus 102 that can implement usage-based disturbance counter clearance. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, medical device, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

In other implementations, the interconnect 106 can be realized as a CXL link. In other words, the interconnect 106 can comport with at least one CXL standard or protocol. The CXL link can provide an interface on top of the physical layer and electricals of a PCIe 5.0 physical layer, for instance. The CXL link can cause requests to and responses from the memory device 108 to be packaged as flits. In still other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

This document describes with reference to FIG. 1 an example computing system architecture having at least one host device 104 coupled to a memory device 108. Computer engineers, however, may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM). Other examples of realizations for at least the memory device 108 include computational storage apparatuses, such as Computational Storage Devices (CSXs), Computational Storage Processors (CSPs), Computational Storage Drives (CSDs), and Computational Storage Arrays (CSAs).

Figure 2:
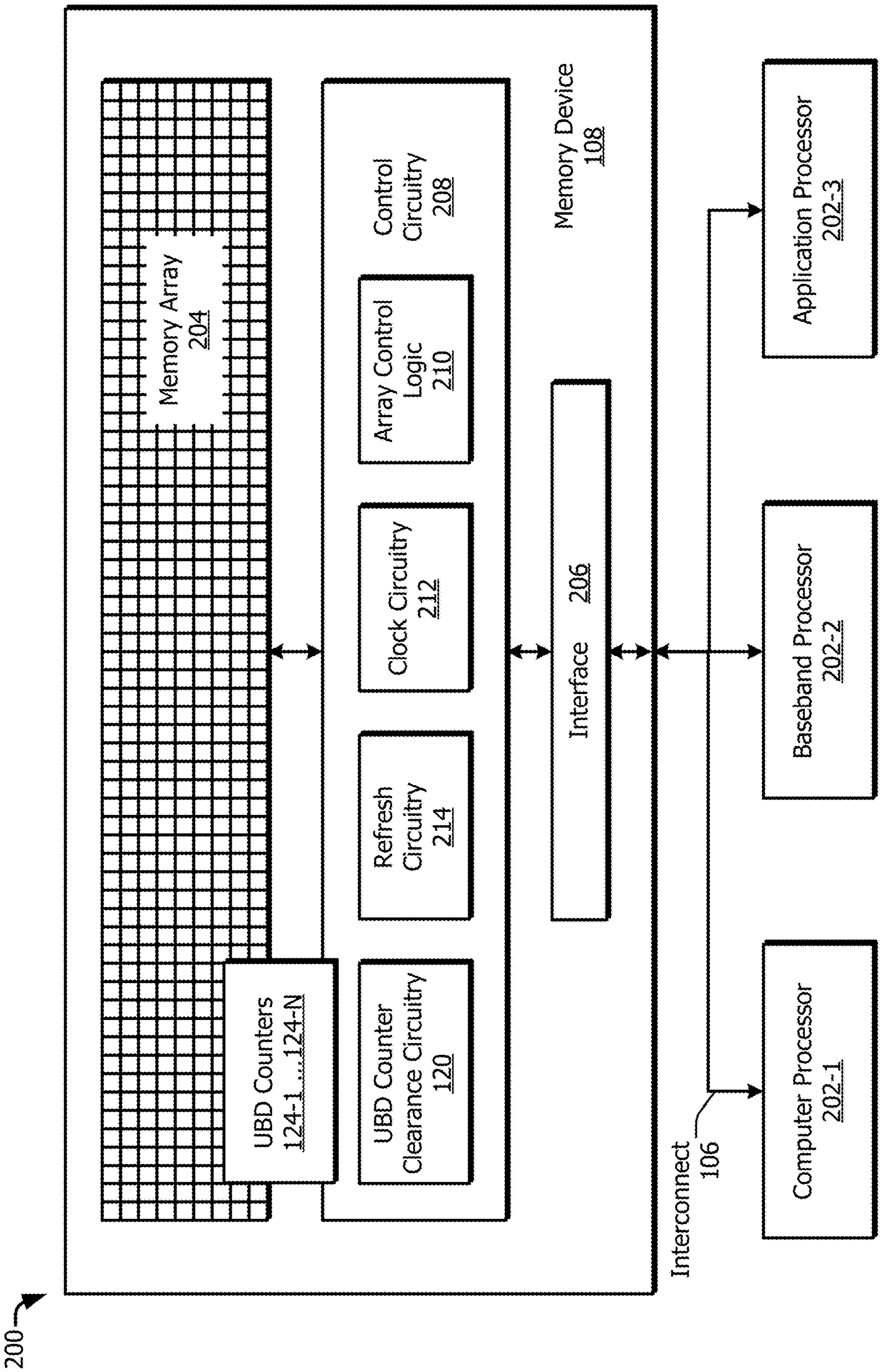
FIG. 2 illustrates an example computing system that can implement aspects of usage-based disturbance counter clearance with respect to a memory device.
Figure 4:
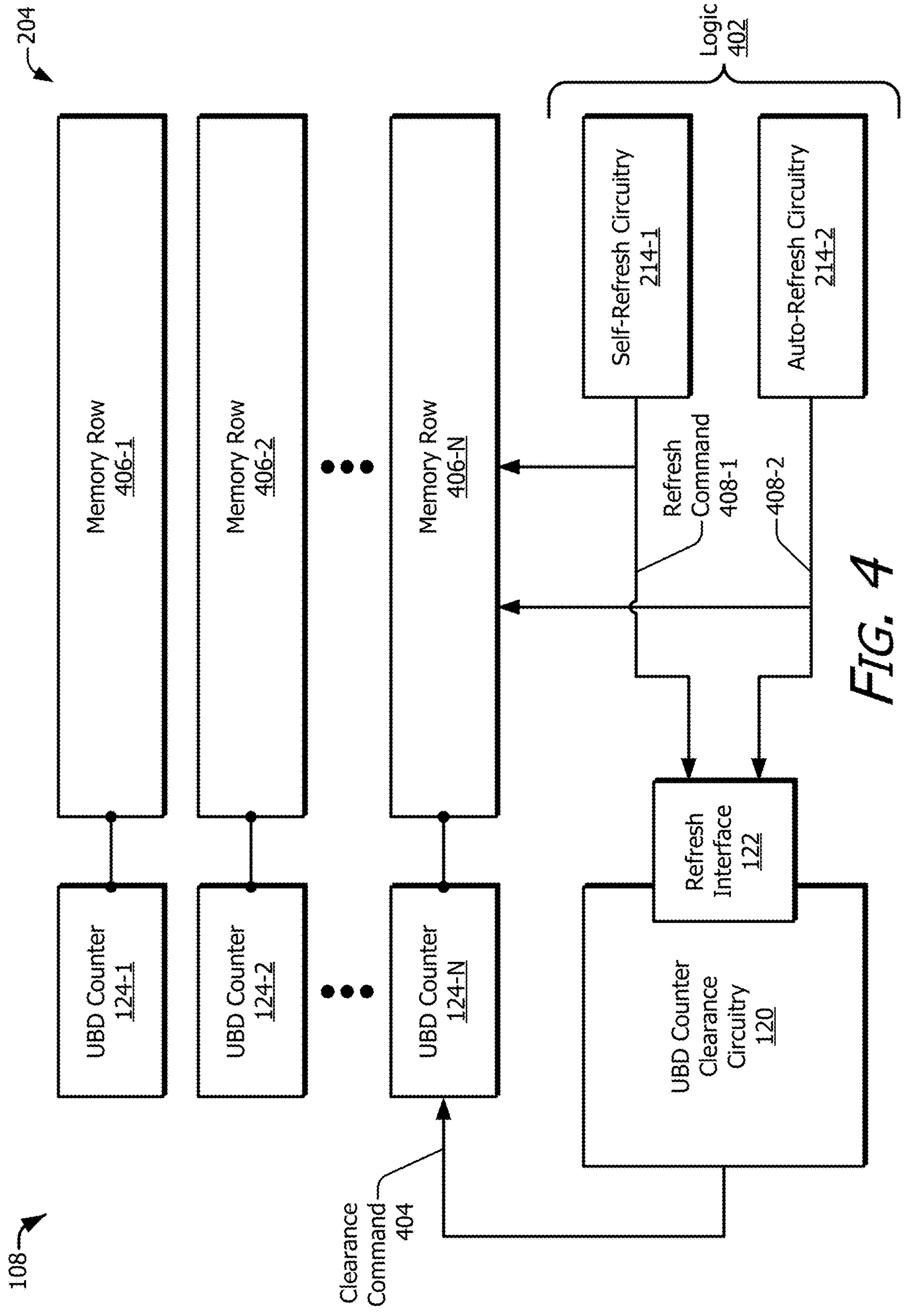
FIG. 4 illustrates a schematic diagram of an example memory device that includes usage-based disturbance counter clearance circuitry and multiple usage-based disturbance counters.

The memory device 108 can form at least part of the main memory of the apparatus 102. The memory device 108 may, however, form at least part of a cache memory, a storage memory, or a system-on-chip of the apparatus 102. The memory device 108 includes at least one memory array (e.g., as shown in FIGS. 2 and 4), usage-based disturbance counter clearance circuitry 120 (UBD counter clearance circuitry 120), and multiple usage-based disturbance counters 124-1 . . . 124-N (multiple UBD counters 124-1 . . . 124-N), where N represents a positive integer, such as at least one UBD counter 124. The UBD counter clearance circuitry 120 can include at least one refresh interface 122 to interface with refresh circuitry (e.g., as shown in FIGS. 2 and 4) of the memory device 108.

In example implementations, the UBD counter clearance circuitry 120 is coupled to the multiple usage-based disturbance counters 124-1 . . . 124-N. The UBD counter clearance circuitry 120 can also be coupled via the refresh interface 122 to at least one circuit that implements refresh operations for the memory device 108. In some cases, the UBD counter clearance circuitry 120 receives at least one signal indicative of a refresh command and/or refresh operation via the refresh interface 122. This signal or another signal can indicate an address of a row being refreshed.

Responsive at least to the refresh command, the UBD counter clearance circuitry 120 clears a UBD counter 124 of the multiple UBD counters 124-1 . . . 124-N. The UBD counter 124 that is cleared corresponds to the row of memory that is subject to, or otherwise the target of, the refresh operation. In these manners, the multiple UBD counters 124-1 . . . 124-N can be regularly, or at least repeatedly, cleared without relying solely on UBD mitigation procedures. Thus, some of the power and temporal overhead involved with addressing the risks of UBD effects is reduced by implementing the techniques that are described herein. Examples of the memory device 108 are further described with respect to FIG. 2.

FIG. 2 illustrates an example computing system 200 that can implement aspects of usage-based disturbance counter clearance with respect to a memory device 108. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106, such as an internal bus of the memory device 108.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 208 can include at least one instance of array control logic 210, clock circuitry 212, refresh circuitry 214, UBD counter clearance circuitry 120, and multiple UBD counters 124-1 . . . 124-N. The array control logic 210 can include circuitry that provides command decoding, address decoding, input/output functions, amplification circuitry, power supply management, power control modes, and other functions.

The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality. The refresh circuitry 214 can perform refresh operations on the memory array 204 in a self-refresh mode or an auto-refresh mode. These refresh modes are described below with reference to FIGS. 4 and 7.

The multiple UBD counters 124-1 . . . 124-N can be disposed with and/or integrated with the control circuitry 208 and/or the memory array 204. Alternatively or additionally, at least a portion of the multiple UBD counters 124-1 . . . 124-N may be positioned elsewhere and/or be incorporated into other circuitry. In example operations, the UBD counter clearance circuitry 120 can clear (singularly or jointly) individual ones of the multiple UBD counters 124-1 . . . 124-N based on interactions with the refresh circuitry 214. For example, the UBD counter clearance circuitry 120 can clear a UBD counter 124 corresponding to a row of the memory array 204 that is undergoing a refresh operation in response to a refresh command. These interactions and operations are described further below with reference to FIGS. 4 and 5.

The interface 206 can couple the control circuitry 208 or the memory array 204 directly or indirectly to the interconnect 106. In some implementations, the UBD counter clearance circuitry 120, the multiple UBD counters 124-1 . . . 124-N, the array control logic 210, the clock circuitry 212, and the refresh circuitry 214 can be part of a single component (e.g., the control circuitry 208). In other implementations, one or more of the UBD counter clearance circuitry 120, the multiple UBD counters 124-1 . . . 124-N, the array control logic 210, the clock circuitry 212, or the refresh circuitry 214 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and a processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus. Also, as discussed above with respect to FIG. 1 and below with respect to FIG. 3, the interconnect 106 can include a CXL link or comport with at least one CXL standard. The CXL link can provide an interface or overlay on top of the physical layer and electricals of, e.g., the PCIe 5.0 physical layer.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board, in a single package, or in a system-on-chip (SoC).

As shown in FIG. 2, the one or more processors 202 may include a computer processor 202-1, a baseband processor 202-2, and/or an application processor 202-3 that are coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, or central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized as one that can communicate over a CXL-compatible interconnect. Accordingly, a respective processor 202 can include or be associated with a respective link controller. Alternatively, two or more processors 202 may access the memory device 108 using a shared link controller. In some of such cases, the memory device 108 may be implemented as a CXL-compatible memory device (e.g., as a CXL Type 3 memory expander), or another memory device that is compatible with a CXL protocol may also or instead be coupled to the interconnect 106.

Example Techniques and Hardware

Figure 3:
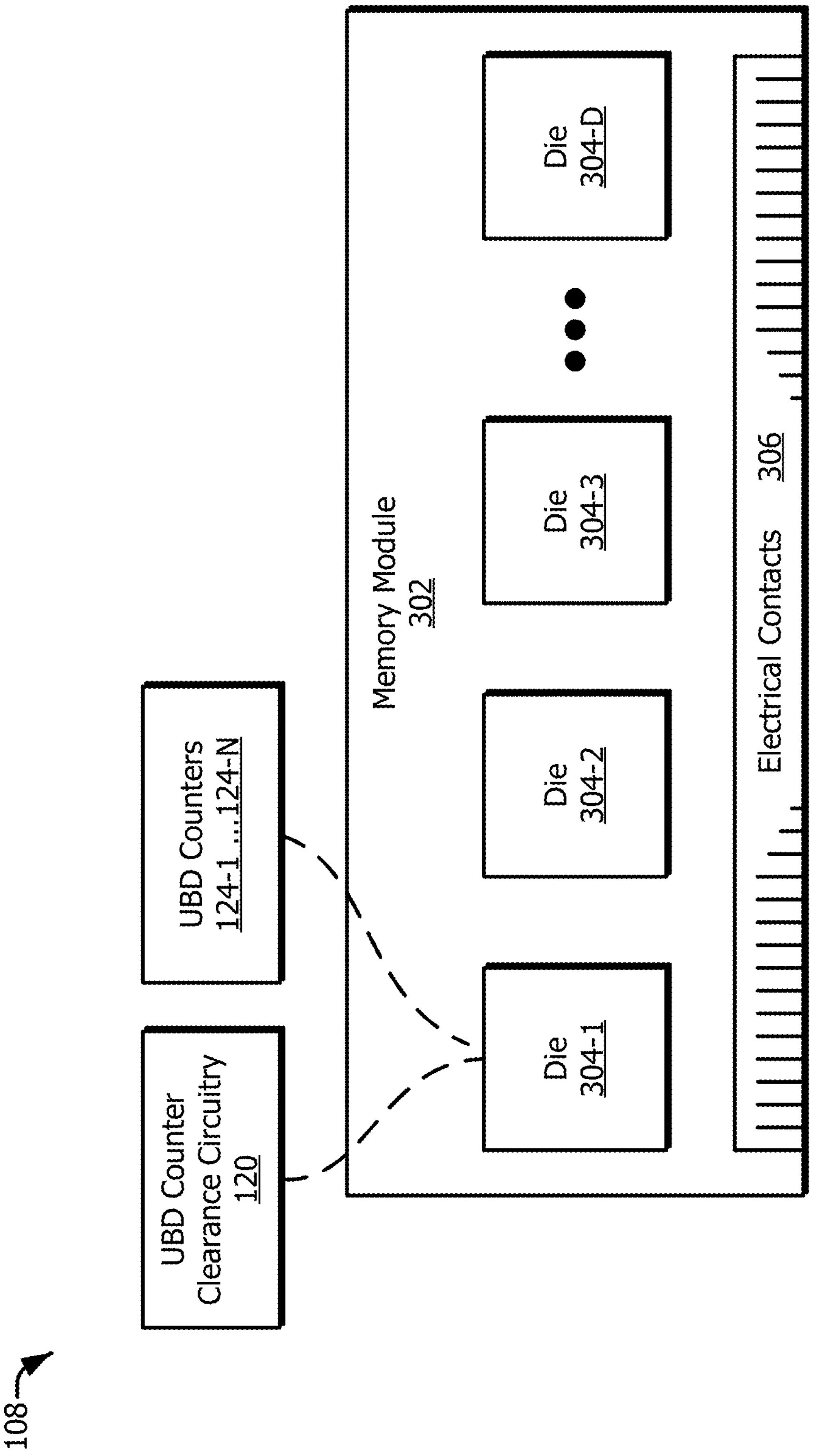
FIG. 3 illustrates an example memory device in which aspects of usage-based disturbance counter clearance may be implemented.

FIG. 3 illustrates an example memory device 108 in which aspects of usage-based disturbance counter clearance can be implemented. The memory device 108 includes a memory module 302, which can include multiple dies 304. As illustrated, the memory module 302 includes a first die 304-1, a second die 304-2, a third die 304-3, and a Dth die 304-D, with D representing a positive integer. One or more of the dies 304-1 to 304-D can include at least one instance of UBD counter clearance circuitry 120 and multiple UBD counters 124-1 . . . 124-N. The memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to any one or more of the multiple dies (or dice) 304-1 through 304-D or to a memory module 302 having two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. Example aspects of the UBD counter clearance circuitry 120 and the multiple UBD counters 124-1 . . . 124-N are described below with respect to FIG. 4. In some cases, the memory module 302 may be part of a CXL memory system or module.

Generally, a memory device such as the ones described herein can be secured to a printed circuit board (PCB), such as a rigid or flexible motherboard. The printed circuit board can include sockets for receiving at least one processor and one or more memory devices. Wiring infrastructure can be disposed on at least one layer of the printed circuit board, enabling communication between two or more components. Some printed circuit boards include multiple sockets that are each shaped as a linear slot designed to accept a dual in-line memory module (DIMM) (e.g., a memory device). These sockets can be fully occupied by dual in-line memory modules while a processor is still able to utilize additional memory. In such situations, the system is capable of greater performance if additional memory is available to the processor.

Printed circuit boards may also include at least one peripheral component interconnect express (PCIe®) slot. A PCIe slot is designed to provide a common interface for various types of components that may be coupled to a PCB. The PCIe protocol can provide higher rates of data transfer, smaller footprints, or both to the PCB compared to some other standards. Accordingly, certain PCBs enable a processor to access a memory device that is connected to the PCB via a PCIe slot.

In some implementations, accessing a memory solely using a PCIe protocol may not offer a desired functionality or reliability. In such implementations, another protocol may be layered on top of the PCIe protocol. As an example, one higher-level protocol is the Compute Express Link™ (CXL™) protocol, such as versions 1.0/1.1/1.x, 2.0, 3.0, and future versions. The CXL protocol can be implemented over a physical layer that is governed by, for example, the PCIe protocol. The CXL protocol can provide a memory-coherent interface capable of high-bandwidth or low-latency data transfers or data transfers with both conditions.

The CXL protocol addresses some of the limitations of PCIe links by providing an interface that leverages, for example, the PCIe 5.0 physical layer while providing lower-latency paths for memory access and coherent caching between processors and memory devices. The CXL protocol can offer high-bandwidth, low-latency connectivity between a host device (e.g., a processor, central processing units (CPUs), a system-on-a-chip (SoC)) and memory devices (e.g., dual in-line memory modules, accelerators, memory expanders). The CXL protocol also addresses growing high-performance computational workloads by supporting diverse processing and memory systems with potential applications in AI, machine learning (ML), advanced driver assistance systems, and other high-performance computing environments. Thus, in addition to or instead of a single in-line memory module (SIMM) or a dual in-line memory module (DIMM), a memory device 108 can also include a CXL memory module.

FIG. 4 illustrates a schematic diagram of an example memory device 108 that includes usage-based disturbance counter clearance circuitry 120 and multiple usage-based disturbance counters 124-1 . . . 124-N. As shown, the memory device 108 includes UBD counter clearance circuitry 120 and refresh circuitry 214. The memory device 108 is also depicted to include multiple memory rows 406-1 . . . 406-N (or multiple rows 406-1 . . . 406-N) and multiple usage-based disturbance counters 124-1 . . . 124-N, with N representing a positive integer. Thus, a quantity of UBD counters may equal a quantity of memory rows; however, the quantity of UBD counters may instead be different from the quantity of memory rows.

In example implementations, the memory device 108 includes logic 402 that is coupled to the memory array 204 and the multiple UBD counters 124-1 . . . 124-N. The logic 402 can include the UBD counter clearance circuitry 120 and any portion of the refresh circuitry 214. The refresh circuitry 214 can issue one or more refresh commands 408-1 and 408-2, such as an internal refresh command 408. The refresh circuitry 214 includes at least two portions: self-refresh circuitry 214-1 and auto-refresh circuitry 214-2.

The self-refresh circuitry 214-1 can control refresh operations in a self-refresh mode in which the memory device 108 (e.g., the self-refresh circuitry 214-1 thereof) generates one or more refresh commands 408-1 in accordance with an internal timer (e.g., a timer that is internal to the memory device 108). These refresh commands may be generated internally at a rate sufficient to refresh memory rows within a minimum refresh interval (tREF) to reliably maintain the data stored in the memory rows. In some cases, a host device instructs the memory device 108 to enter the self-refresh mode and subsequently exit the mode. The memory device 108 may operate in the self-refresh mode in conjunction with a low-power mode in which the memory device does not service external memory requests (e.g., does not respond to memory requests, if any, from the host device).

The auto-refresh circuitry 214-2 can control refresh operations in an auto-refresh mode in which the host device provides (e.g., transmits over an interconnect) auto-refresh commands to the memory device 108. In response to an auto-refresh command from the host device, the memory device 108 can generate at least one refresh command 408-2. Thus, the self-refresh circuitry 214-1 can provide the refresh command 408-1 based on internally generated signaling or timing. The auto-refresh circuitry 214-2 can provide the refresh command 408-2 based on an auto-refresh command received from a source that is external to the memory device 108. Although illustrated as separate blocks, the self-refresh circuitry 214-1 and the auto-refresh circuitry 214-2 can be at least partially integrated together and/or can share circuitry, such as that used to transmit an internal refresh command 408 to the refresh interface 122 of the UBD counter clearance circuitry 120 or to access circuitry for the multiple memory rows 406-1 . . . 406-N.

In example operations, in the self-refresh mode, the self-refresh circuitry 214-1 transmits the refresh command 408-1 to the UBD counter clearance circuitry 120 and to a row 406 being refreshed in a self-refresh operation, such as the Nth memory row 406-N. In the auto-refresh mode, the auto-refresh circuitry 214-2 transmits the refresh command 408-2 to the UBD counter clearance circuitry 120 and to a row 406 being refreshed in an auto-refresh operation, such as the Nth memory row 406-N. Although not explicitly depicted in FIG. 4, the refresh command 408 can be transmitted to access circuitry, such as the array control logic 210 (of FIG. 2) or the sense amplifiers (of FIG. 5), that can cause the Nth memory row to be refreshed. Thus, the logic 402 (e.g., the refresh circuitry 214 thereof) can perform a refresh operation on a row 406 of the multiple rows 406-1 . . . 406-N responsive to at least one refresh command that is internal to the memory device 108 (e.g., a refresh command 408) and/or to at least one refresh command that is received from an external source.

In accordance with described implementations, the UBD counter clearance circuitry 120 can also receive the refresh command 408, e.g., via the refresh interface 122. In response to the refresh command 408, the UBD counter clearance circuitry 120 issues a clearance command 404. The clearance command 404 can be issued to clear a UBD counter 124 that corresponds to the row 406 that is being refreshed. For instance, the clearance command 404 can be issued for the Nth UBD counter 124-N that corresponds to the Nth row 406-N. Thus, the logic 402 (e.g., the UBD counter clearance circuitry 120 thereof) can clear a usage-based disturbance counter 124-N of the multiple usage-based disturbance counters 124-1 . . . 124-N responsive to at least one refresh command 408. The usage-based disturbance counter 124-N can store a quantity of accesses to the row 406-N of the multiple rows 406-1 . . . 406-N. Although not shown, the UBD counter clearance circuitry 120 can additionally or alternatively clear a UBD counter 124 in response to a refresh command that is from an external source, e.g., without the external refresh command being arbitrated by, or routed through, the refresh circuitry 214.

The UBD counter clearance circuitry 120 can clear a UBD counter 124 responsive to at least one refresh command 408 in any of a number of different manners. For example, the UBD counter clearance circuitry 120 can clear the UBD counter 124 by writing a known value into the UBD counter 124. This known value can be a constant or another determinable value. For instance, the UBD counter clearance circuitry 120 can clear the UBD counter 124 by writing a zero ("0") into each bit of multiple bits of the UBD counter 124.

Generally, the multiple usage-based disturbance counters 124-1 . . . 124-N can be associated with the memory array 204. In some cases, each respective usage-based disturbance counter 124-*x* of the multiple usage-based disturbance counters 124-1 . . . 124-N can correspond to a respective row 406-*x* of the multiple rows 406-1 . . . 406-N of the memory array 204. There may be a one-to-one correspondence between each UBD counter 124 and each row 406 across at least a portion of the memory array 204. Alternatively, one UBD counter 124 may correspond to multiple rows 406 to reduce a total quantity of UBD counters in exchange for additional mitigation procedure overhead.

In some cases, the multiple usage-based disturbance counters 124-1 . . . 124-N can be integrated with the memory array 204. In some aspects, such integration can relate to being disposed within or adjacent to the memory array 204, to being part of a same collapsible power domain, to sharing access circuitry, to being associated with a same memory bank, to sharing common word lines, some combination thereof, and so forth. An example architecture for sharing common word lines is described next with reference to FIG. 5.

Figure 5:
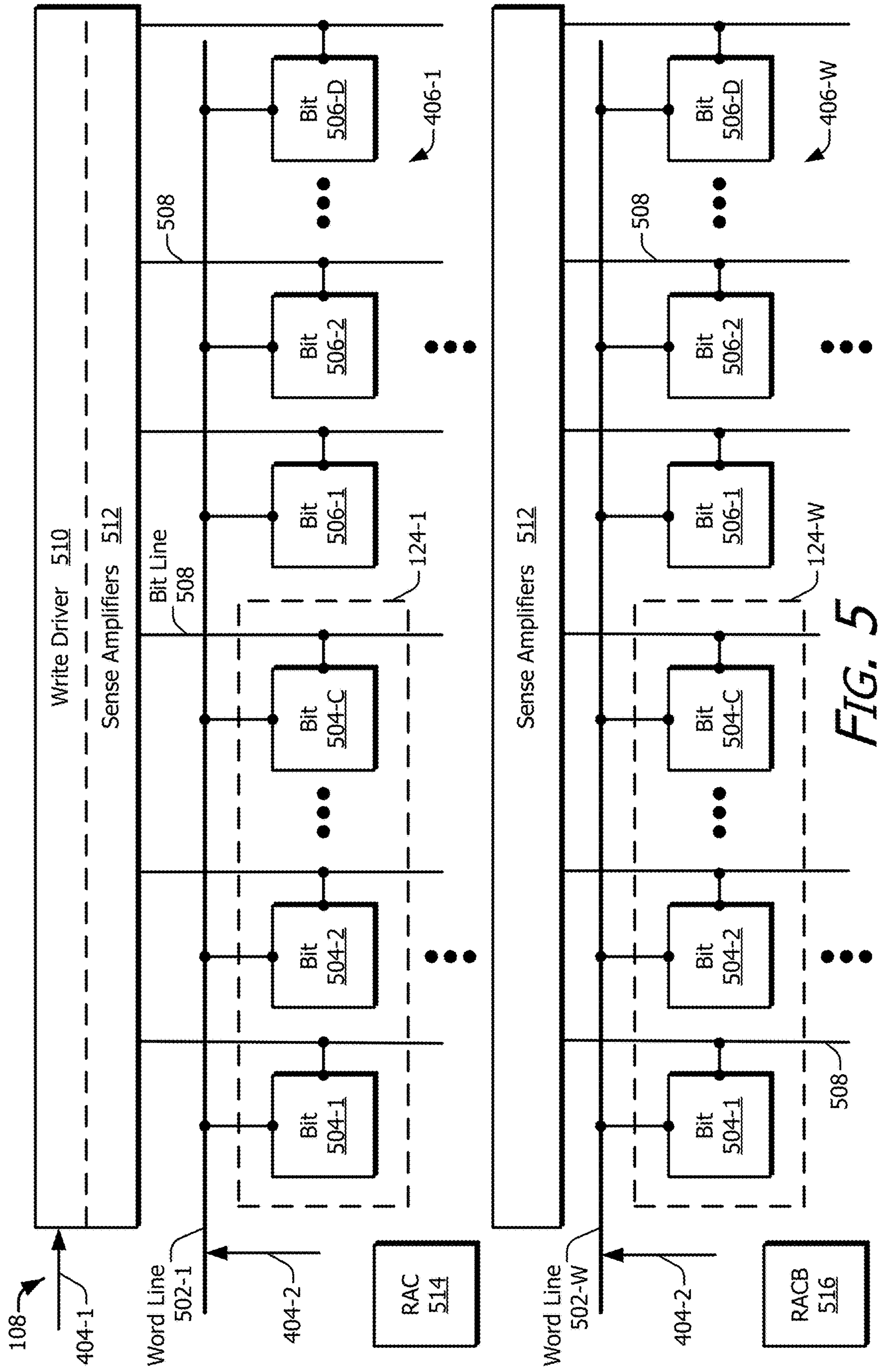
FIG. 5 illustrates a schematic diagram of an example memory device that includes multiple usage-based disturbance counters coupled to respective ones of multiple word lines of a memory array.

FIG. 5 illustrates a schematic diagram of an example memory device 108 that includes multiple usage-based disturbance counters 124-1 . . . 124-W coupled to respective ones of multiple word lines 502-1 . . . 502-W, with W representing a positive integer greater than one. As illustrated, each respective UBD counter 124 of the multiple UBD counters 124-1 . . . 124-W includes multiple bits 504-1 . . . 504-C, with C representing a positive integer. Each respective row 406 of multiple rows 406-1 . . . 406-W includes multiple bits 506-1 . . . 506-D, with D representing a positive integer. The values of C and D may be different, such as D being greater than C. The memory device 108 can also include at least one write driver 510, one or more sense amplifiers 512, at least one refresh address counter 514 (RAC 514), and at least one refresh address cycle buffer 516 (RACB 516).

In example implementations, each respective UBD counter 124 and row 406 is coupled to a respective word line 502. The multiple bits 504-1 . . . 504-C of each UBD counter 124 and the multiple bits 506-1 . . . 506-D of each row 406 are coupled to a respective word line 502. Further, each bit 504 and 506 can be coupled to a bit line, such as the indicated bit line 508. The bit lines can be coupled to the write driver 510 or the sense amplifiers 512, including to each of them. In operation, the sense amplifiers 512 can read data from the bits, and the write driver 510 can write data to the bits. Reading and writing can be enabled for certain bits by activating a word line 502 that is coupled to those bits.

As shown for some implementations, a memory array 204 (e.g., of FIGS. 2 and 4) can include multiple word lines 502-1 . . . 502-W. Each respective usage-based disturbance counter 124 of the multiple usage-based disturbance counters 124-1 . . . 124-W can be coupled to a respective word line 502 of the multiple word lines 502-1 . . . 502-W. Similarly, each respective row 406 of the multiple rows 406-1 . . . 406-W can be coupled to a respective word line 502 of the multiple word lines 502-1 . . . 502-W.

The refresh address counter 514 can store an address of at least one row 406 that is to be refreshed (e.g., that is targeted for a refresh operation). The stored address can correspond, for example, to a current row being refreshed, a next row to be refreshed, and so forth. The refresh address cycle buffer 516 can store any of one or more indications of whether each of a set of relevant rows have been refreshed in a current self-refresh mode—e.g., whether a refresh address cycle or round has been completed. Examples of the refresh address cycle buffer 516 are described below with reference to FIG. 7.

In example operations, the refresh circuitry 214 (e.g., of FIGS. 2 and 4) may be capable of refreshing multiple rows substantially simultaneously, such as by being at least partially overlapping in time or by being coupled to a common write driver 510. The multiple rows may be physically adjacent to each other, may be separated by one or more other rows, may be coupled to different sense amplifiers 512, or may be in different banks. The refresh address counter 514 can store multiple addresses, such as one address per memory row that is being simultaneously refreshed, or the memory device may include multiple refresh address counters 514 to store multiple refresh addresses. Alternatively, the refresh address counter 514 may store fewer addresses, such as a few as a single address. In these cases, the other addresses may be offsets of the stored address or predetermined by hardwired circuitry in another manner.

In scenarios in which multiple rows are being refreshed substantially simultaneously or otherwise in a grouped manner, multiple UBD counters can likewise be cleared substantially simultaneously or responsive to the same at least one refresh operation, which may be a grouped refresh operation. As shown in FIG. 5, the clearance command 404 (also of FIG. 4) can include at least two components: a write driver command 404-1 and a word line activation command 404-2. The word line activation command 404-2 can activate at least one word line 502, such as a first word line 502-1 and a second word line 502-W. The word line activation enables the bits coupled to the given word line 502 to be read from or written to. Generally, an array refresh pump can be architected to activate multiple word lines substantially simultaneously.

In response to at least one refresh command 408 (e.g., of FIG. 4), the UBD counter clearance circuitry 120 (e.g., of FIG. 4) can generate and provide the write driver command 404-1 and the word line activation command 404-2, the latter of which may be coupled to multiple word lines. Additionally or alternatively, other circuitry, such as refresh circuitry 214, can generate or provide the word line activation command 404-2 as part of a refresh operation. As described above with reference to FIG. 4, the write driver 510 can write a known value into each UBD counter 124 that is coupled to an activated word line 502 via one or more bit lines 508. A read phase from each UBD counter 124 can be omitted because the value stored in the UBD counter 124 does not need to be incremented, compared against a threshold, or otherwise analyzed if the counter is being cleared responsive to a refresh operation in accordance with certain implementations that are described herein.

Thus, in some cases, the refresh circuitry 214 (e.g., of FIG. 4) can perform a refresh operation on two or more rows 406-1 and 406-W of the multiple rows 406-1 . . . 406-W responsive to at least one refresh command that is propagated internally (e.g., the refresh command 408). Further, the UBD counter clearance circuitry 120 (e.g., of FIG. 4) can clear two or more usage-based disturbance counters 124-1 and 124-W of the multiple usage-based disturbance counters 124-1 . . . 124-W responsive to the at least one refresh command. Here, each respective usage-based disturbance counter 124 of the two or more usage-based disturbance counters 124-1 and 124-W can store a respective quantity of accesses to a respective row 406 of the two or more rows 406-1 and 406-W.

To perform a clearance of a UBD counter 124, the UBD counter clearance circuitry 120 can use at least one write driver 510 of the memory device 108. Accordingly, the write driver 510 can be architected to have sufficient power to clear substantially simultaneously the two or more usage-based disturbance counters 124-1 and 124-W of the multiple usage-based disturbance counters 124-1 . . . 124-W responsive to the at least one refresh command. For example, the write driver 510 can have sufficient power to drive two sets of the sense amplifiers 512. In some cases, the clearance can be performed substantially simultaneously by, for example, being performed at least partially overlapping in time or by being driven by a common write driver 510 while each UBD counter 124 is coupled to an activated word line 502, such as being coupled to a respective activated word line 502. It should be noted that some time elapses for a signal realized by a voltage or a current to traverse a length of a bit line 508 between two UBD counters that are being simultaneously cleared.

In some aspects, the at least one refresh command 408 can be realized with multiple refresh commands. Thus, each respective row 406 may be refreshed and each respective corresponding UBD counter 124 may be cleared based on a respective refresh command 408, even if the refreshment and clearance is being performed substantially simultaneously. In other aspects, however, the at least one refresh command 408 can be realized with a single refresh command 408 that triggers multiple refresh and clearance operations, which can be performed sequentially or substantially simultaneously.

Figure 6:
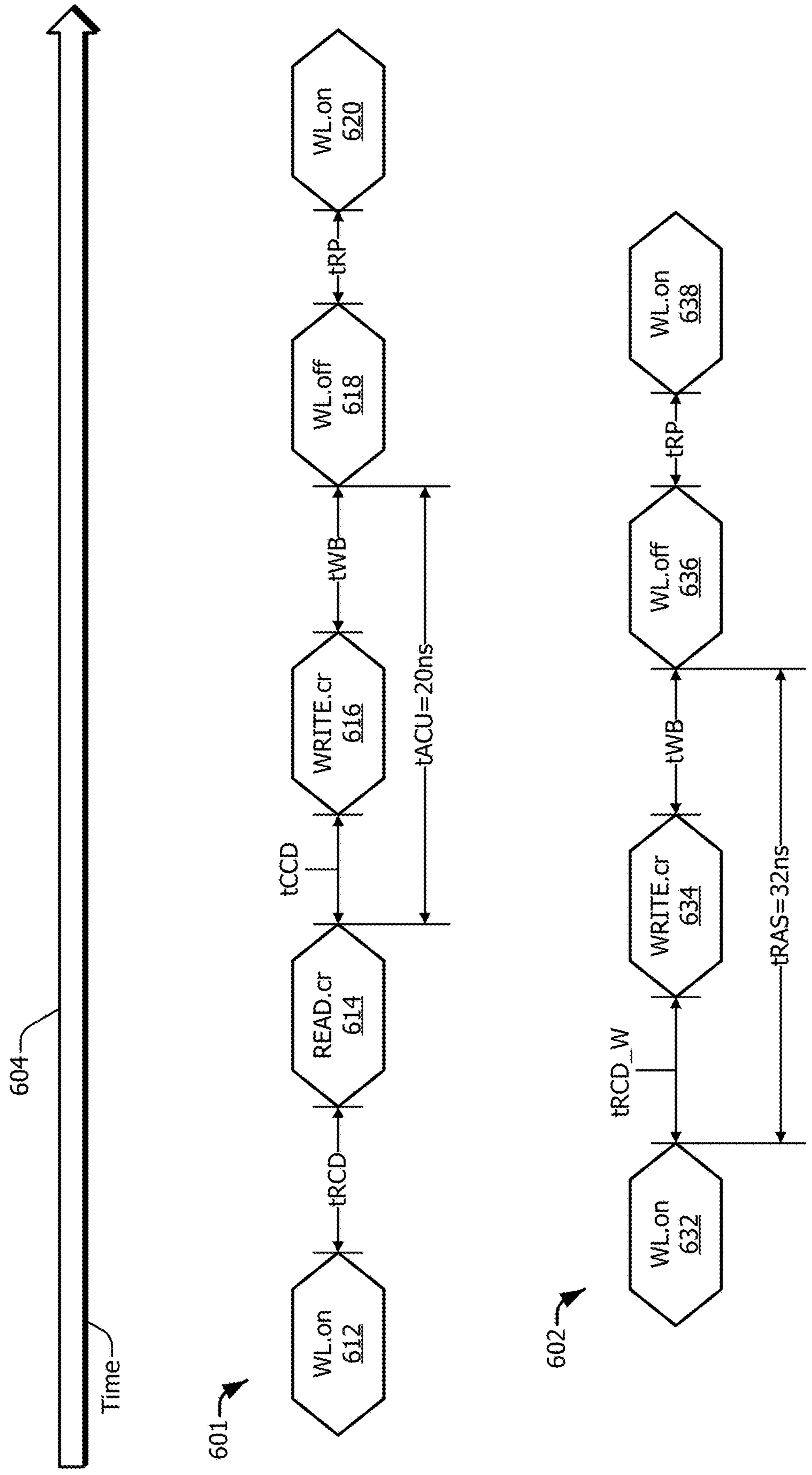
FIG. 6 illustrates an example timing diagram for performing a clearance of a usage-based disturbance counter.

FIG. 6 illustrates an example timing diagram 602 for performing a clearance of a usage-based disturbance counter in accordance with the techniques that are described herein. In an example timing diagram 601, in contrast, the UBD counter is being updated, so the counter is read before being written to for an incrementing operation. In the timing diagram 602, however, the reading operation can be omitted to reduce an amount of time that elapses to complete a clearance of the UBD counter. The time periods between operations are not necessarily drawn to scale. Also, any illustrated timings are provided by way of example only, for other times can be implemented. As indicated by an arrow 604, time increases in a rightward direction.

With respect to the timing diagram 601, a word line on operation 612 (WL.on) is performed. An RAS-to-CAS delay (tRCD) transpires before the UBD counter can be read at the counter reading operation 614 (READ.cr). After a consecutive column delay (tCCD) transpires, which may be long or short, the counter writing operation 616 (WRITE.cr) for the UBD counter is performed. The consecutive column delay (tCCD) may be approximately 5 nanoseconds (ns) in some memory architectures. The counter writing operation 616 can occupy a write back time (tWB), which may be approximately 15 ns in some memory architectures. The indicated array counter update (ACU) duration (tACU) may be approximately 20 ns in some memory architectures. The word line can then be turned off with the word line off operation 618 (WL.off). After a row precharge time (tRP), another word line can be activated with the word line on operation 620.

With respect to the timing diagram 602 for a counter clearance, a read operation for the UBD counter 124 can be omitted. Instead, a write operation is performed on the UBD counter 124 responsive to a refresh operation being performed on a corresponding row 406. The UBD counter clearance circuitry 120 or the refresh circuitry 214 can issue a word line activation command 404-2 to perform a word line on operation 632 (WL.on). Responsive to an RAS-to-CAS delay for writes (tRCD_W) transpiring, the write driver 510 can perform a write to the UBD counter 124.

This counter write operation 634 (WRITE.cr) can be performed responsive to the UBD counter clearance circuitry 120 issuing a write driver command 404-1. Like the flow of the timing diagram 601, the write back occupies a write back time (tWB). In some memory architectures, a minimum row active time (tRAS) may be 32 ns, which can correspond to a time between a word line on operation and a word line off operation. After the write back time, the word line can then be turned off with a word line off operation 636 (WL.off). After a row precharge time (tRP), another word line can be activated with a word line on operation 638. The next word line can be activated, or turned on, for another counter clearance operation performed in conjunction with a refresh operation on a corresponding row.

The elapsed time for the timing diagram 602 can be shorter than the elapsed time for the timing diagram 601 for multiple reasons. First, the counter reading operation 614 (READ.cr) is omitted in the timing diagram 602. Second, an RAS-to-CAS delay for a write operation can be shorter than an RAS-to-CAS delay for a read operation (e.g., tRCD>tRCD_W). Third, the consecutive column delay (tCCD) can be avoided with the timing diagram 602. Accordingly, clearing a UBD counter 124 as described herein can be faster than updating the counter.

Figure 7:
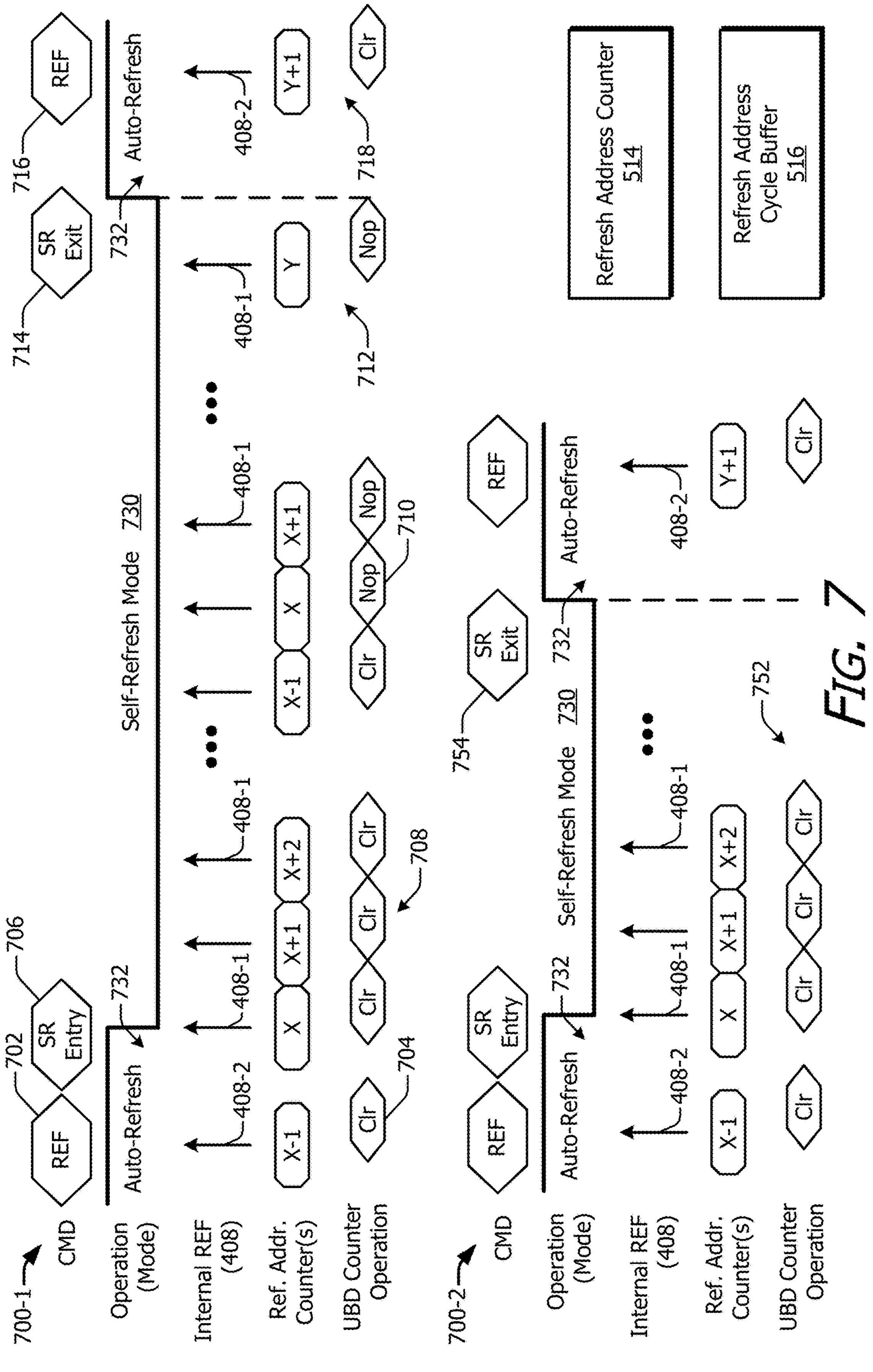
FIG. 7 illustrates example timing diagrams for usage-based disturbance counter clearance in self-refresh scenarios.

FIG. 7 illustrates example timing diagrams 700-1 and 700-2 for usage-based disturbance counter clearance in self-refresh scenarios. In a self-refresh mode 730, a memory device 108 may enter a low-power mode or may cease receiving or processing memory requests, such as read and write operations. Thus, the memory device 108 may enter a low-power mode and cease responding to memory access requests in accordance with a permitted herein, but optional, inclusive-or interpretation of the word "or." If memory access requests are not being performed, then the values in the multiple UBD counters 124-1 . . . 124-N are not increasing.

Accordingly, once each UBD counter 124 of the multiple UBD counters 124-1 . . . 124-N has been cleared during a given self-refresh mode 730, the counter values are unchanging and further clearance operations are obviated. By avoiding clearance operations that change no values or provide no benefit, power can be saved during the same self-refresh mode 730. As described herein, the UBD counter clearance circuitry 120 can avoid repeatedly clearing counters that are already cleared during self-refresh modes. Example implementations to employ these principles and prevent cleared counters from being repeatedly cleared, or re-cleared, are described with reference to FIG. 7.

At the timing diagram 700-1, the memory device 108 is in the self-refresh mode 730 sufficiently long such that rows are being refreshed past one cycle or round through the relevant rows (e.g., the rows in a given memory array, bank, or chip that are subject to being self-refreshed). At 702, an external refresh command (REF) causes the memory device 108 (e.g., the auto-refresh circuitry 214-2 thereof) to refresh a row having an address of "X−1" in an auto-refresh mode 732 using a refresh command 408-2. The auto-refresh mode may also be referred to as a regular refresh mode. The UBD counter clearance circuitry 120 clears the corresponding UBD counter 124 at 704. The next external command at 706 is a self-refresh entry command (SR Entry), so the memory device 108 switches from the auto-refresh mode 732 to the self-refresh mode 730.

In the self-refresh mode 730, the self-refresh circuitry 214-1 takes responsibility for generating refresh commands 408-1 using an on-chip timer or clock. The self-refresh circuitry 214-1 generates multiple refresh commands 408-1 for row addresses "X," "X+1," and "X+2." These row addresses may be stored in one or more refresh address counters, such as at least one refresh address counter 514. As described above with reference to FIG. 5, multiple memory rows may be refreshed substantially simultaneously or otherwise as a group. Respective ones of the multiple memory addresses for the grouped refreshes may be stored in respective ones of the multiple refresh address counters 514, may be determined as respective offsets from a row address stored in one refresh address counter 514, and so forth. For each refreshed row, the UBD counter clearance circuitry 120 clears the corresponding UBD counter 124 as shown by the "Clr" operations at 708. This can continue at least until the self-refresh operations complete one cycle through the relevant memory rows. Thus, clearance operations ("Clr") by the UBD counter clearance circuitry 120 can continue through at least row address "X−1."

The self-refresh mode 730 started at row address "X." Accordingly, the UBD counter clearance circuitry 120 can cease performing counter clearance operations once the refresh cycle returns to the row address "X." If the memory device is refreshing multiple rows as a group and employs multiple refresh address counters 514, these multiple counters can reset—or return to a "starting" value such as the row address "X"—at a substantially same time or in response to a same group of row refreshes. As shown at 710, the UBD counter clearance circuitry 120 performs no operation ("Nop") starting at the row address "X." The no-operation for UBD counter clearance may pertain to multiple UBD counters if the memory device refreshes multiple memory rows as a group. In some cases, this no-operation function for UBD counter clearance opportunities, may continue until the self-refresh mode ends. As depicted at 712, a row address "Y" is the final row that is refreshed in the current self-refresh mode 730. No clearance operation need be performed for the UBD counter corresponding to the row having the address "Y."

In response to receiving a self-refresh exit command (SR Exit) at 714, the memory device 108 exits the self-refresh mode 730 and again enters the auto-refresh mode 732. The self-refresh circuitry 214-1 cedes control to the auto-refresh circuitry 214-2. At 716, the auto-refresh circuitry 214-2 receives an external refresh command (REF). In response to the external refresh command, the auto-refresh circuitry 214-2 produces an internal refresh command 408-2 for the next address, row address "Y+1." In response to the external refresh command at 716 or the internal refresh command 408-2, the UBD counter clearance circuitry 120 clears the UBD counter 124 that corresponds to the row having the address "Y+1" at 718.

At the timing diagram 700-2, the memory device 108 is not in the self-refresh mode 730 sufficiently long so that rows are being refreshed past one cycle through a relevant set of rows (e.g., the rows in a given memory array, bank, or chip). Thus, the UBD counter clearance circuitry 120 does not cease performing counter clearance operations at 752 during the self-refresh mode 730 before a self-refresh exit command (SR Exit) is received at 754 from an external source, such as a host device. During a self-refresh mode 730 that is sufficiently long, the UBD counter clearance circuitry 120 can determine if or when to cease clearing UBD counters. Example approaches to such a determination are described next.

In some approaches, a timer can track elapsed time in the self-refresh mode 730. After a period of time during which each memory row is to be refreshed to safely maintain the data stored therein (e.g., a minimum refresh time (tREF)), the UBD counter clearance circuitry 120 can determine that each row has been refreshed and that each corresponding UBD counter 124 has therefore been cleared. After expiration of the timer or time period, the UBD counter clearance circuitry 120 can cease clearing the multiple UBD counters 124-1 . . . 124-N.

In other approaches, the refresh address counter 514 or the refresh address cycle buffer 516, including each of them, can be used to track counter clearances. The at least one refresh address counter 514 can store a current address of a row 406 to be refreshed, such as "X," "X+1," "X+2," and so forth. In some implementations, the refresh address counter 514 may correspond to a CAS-before-RAS refresh (CBR) counter. The UBD counter clearance circuitry 120 may use the refresh address counter 514 in conjunction with the refresh address cycle buffer 516 in different ways.

In a first way, the refresh address cycle buffer 516 can store an address at which the self-refresh mode 730 starts, such as the row address "X" in the timing diagram 700-1. The UBD counter clearance circuitry 120 can compare the value in the refresh address counter 514 to the value in the refresh address cycle buffer 516. If the values are equal, the UBD counter clearance circuitry 120 can cease performing the clearance operations on the multiple UBD counters 124-1 . . . 124-N as shown at 710. This may provide a relatively more precise stopping point in which no or only a few UBD counters are cleared twice. Even if the memory device refreshes multiple memory rows as a group, the circuitry may perform one comparison operation against one starting memory row address but cease performing clearance operations across the group based on the one comparison operation.

In a second way, the refresh address cycle buffer 516 can store as few bits as a single bit. With the second way, the bit can initially be set to a "0." Responsive to the refresh address counter 514 reaching a particular value (e.g., all zeros), the UBD counter clearance circuitry 120 checks the refresh address cycle buffer 516 and switches it from the initial value to a different value (e.g., a "1"). Responsive to the refresh address counter 514 reaching the particular value again, the refresh address cycle buffer 516 is checked again. Because the refresh address cycle buffer 516 has the different (non-initial) value, the self-refresh mode 730 has completed at least one full cycle through the relevant rows and corresponding counters. The UBD counter clearance circuitry 120 can therefore cease performing the clearance operations on the multiple UBD counters 124-1 . . . 124-N as shown at 710. This may provide a relatively less precise stopping point in which many UBD counters (up to almost all in edge cases) are cleared twice. However, the circuitry with the second way may be simpler as compared to the first way.

With reference to the timing diagram 700-1, the logic 402 can enter a self-refresh mode 730 at 706 and refresh each row 406 of multiple rows 406-1 . . . 406-N responsive to entry into the self-refresh mode 730. The logic 402 can also clear each usage-based disturbance counter 124 of the multiple usage-based disturbance counters 124-1 . . . 124-N as shown at 708 responsive to refreshing each corresponding row 406 of the multiple rows 406-1 . . . 406-N. During the self-refresh mode 730, the logic 402 can cease clearing the multiple usage-based disturbance counters 124-1 . . . 124-N as shown at 710.

In some cases, the logic 402 can also refresh at least one row 406 of the multiple rows 406-1 . . . 406-N while in the self-refresh mode 730 after cessation of the clearing of the multiple usage-based disturbance counters 124-1 . . . 124-N during the self-refresh mode 730 as indicated at 710 and 712. Further, the logic 402 can clear each usage-based disturbance counter 124 corresponding to all rows 406-1 . . . 406-N (where N equals the total relevant rows in this instance) of the memory array 204 being operated in the self-refresh mode 730 at least once before the cessation of the clearing of the multiple usage-based disturbance counters 124-1 . . . 124-N during the self-refresh mode 730. Multiple example approaches and ways are described above to ensure that each UBD counter 124 corresponding to the relevant memory rows is cleared at least once. However, if fewer than all relevant UBD counters are cleared before clearance operations are ceased, substantial benefit (e.g., at least delayed mitigation procedures) can still arise from those counters that are cleared once.

In other cases, as shown in FIGS. 5 and 7, the memory device 108 can include a refresh address counter 514 to store an address of a row 406 targeted for a refresh operation. Given the presence of the refresh address counter 514, the logic 402 can cease clearing the multiple usage-based disturbance counters 124-1 . . . 124-N during the self-refresh mode based on the refresh address counter 514.

In some aspects, the logic 402 can cease clearing the multiple usage-based disturbance counters 124-1 . . . 124-N during the self-refresh mode 730 based on the refresh address counter 514 repeating an address value of a row 406. Such repetition can be determined, for instance, by setting a bit to a value responsive to refreshing a row of a particular address and then inspecting that bit when the refresh cycle returns to the particular address as described above.

In other aspects, the memory device 108 can also include a buffer, such as a refresh address cycle buffer 516, to store an address indicative that a refresh cycle has been completed through each of the rows 406-1 . . . 406-N of the memory array 204 that is subject to the self-refresh mode 730. Given the presence of the buffer, the logic 402 can cease clearing the multiple usage-based disturbance counters 124-1 . . . 124-N during the self-refresh mode 730 based on the address stored in the buffer (e.g., the refresh address cycle buffer 516) and the refresh address counter 514.

Example Method

Figure 8:
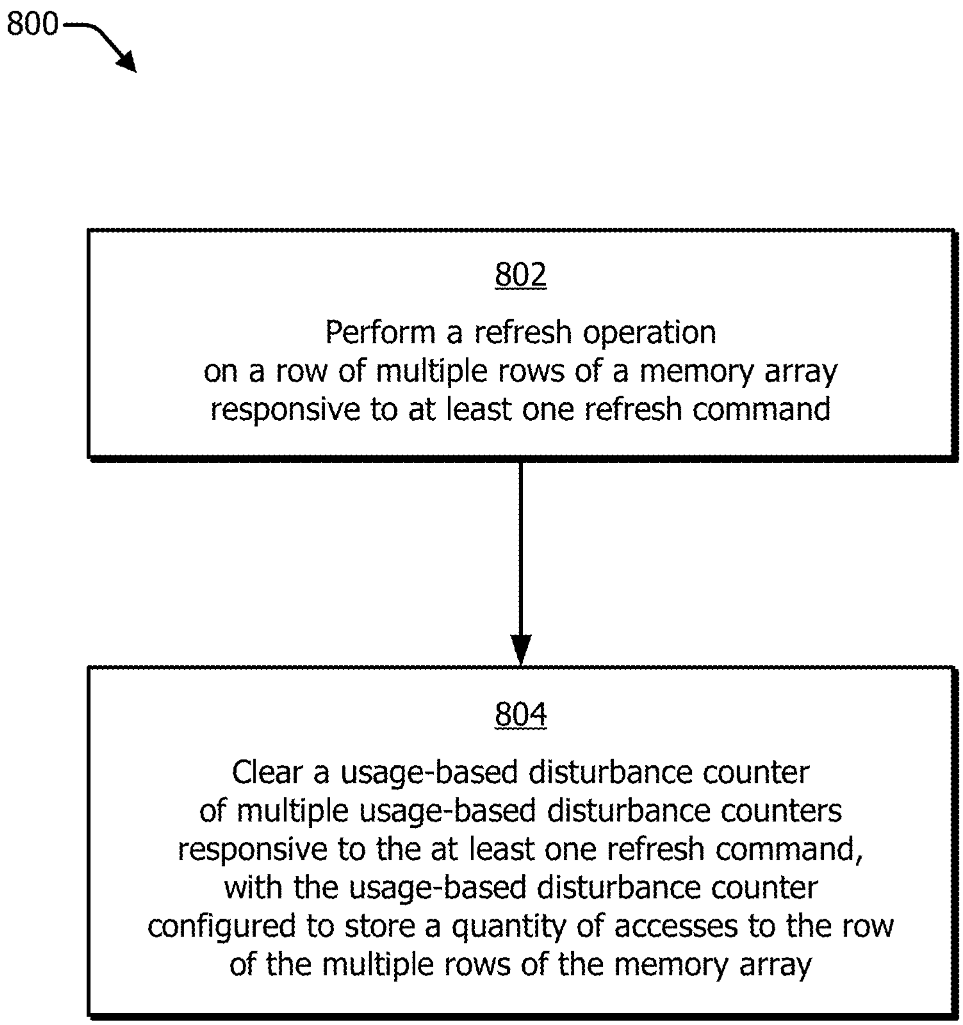
FIG. 8 illustrates an example method for implementing aspects of usage-based disturbance counter clearance.
Figure 9:
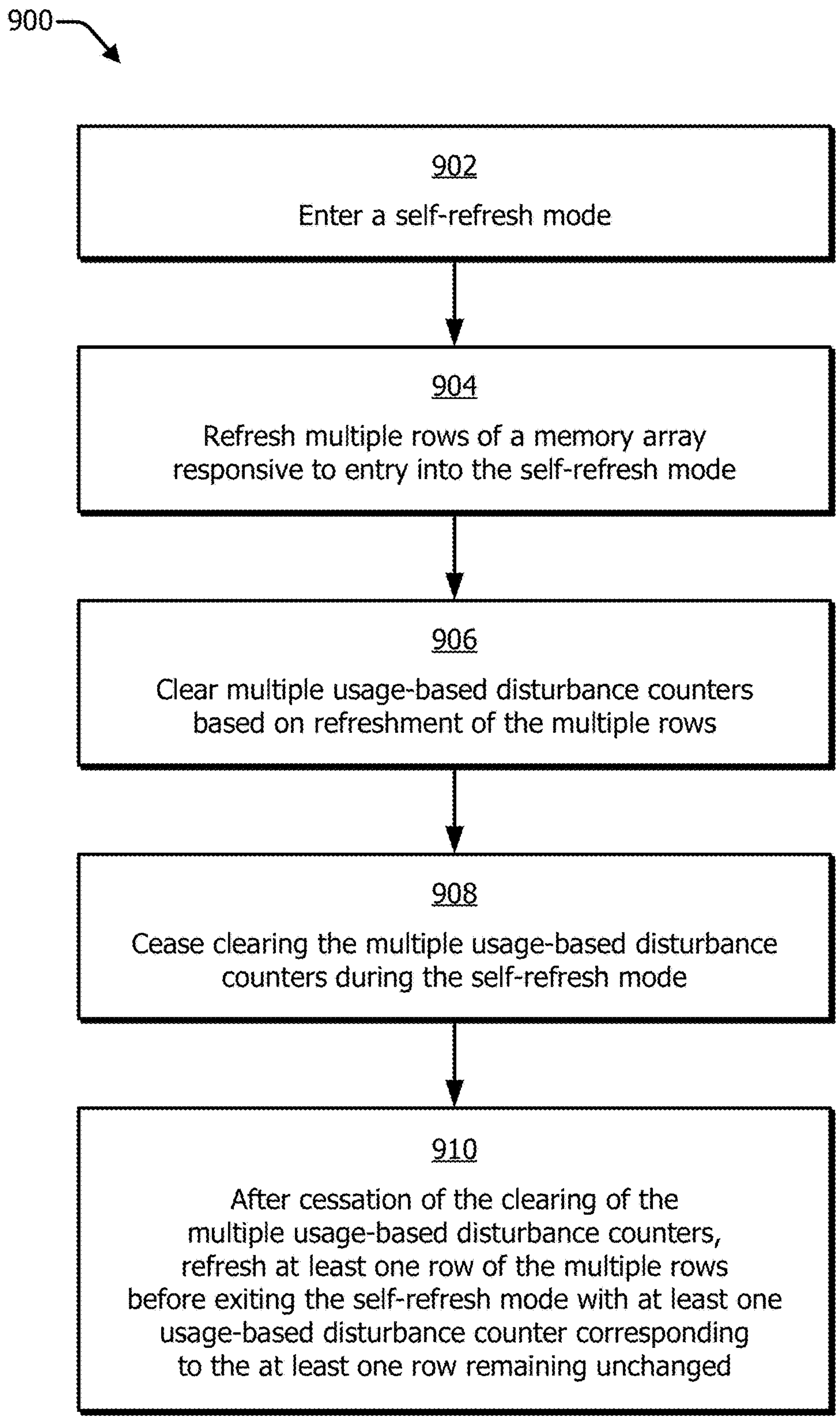
FIG. 9 illustrates an example method for implementing aspects of usage-based disturbance counter clearance in self-refresh scenarios.

This section describes example methods for implementing usage-based disturbance counter clearance with reference to the flow diagrams of FIGS. 8 and 9. These descriptions may also refer to components, entities, and other aspects depicted in FIGS. 1 to 7 by way of example only. The described methods are not necessarily limited to performance by one entity or multiple entities operating on one device.

FIG. 8 illustrates a flow diagram 800, which includes operations 802 through 804. In aspects, operations of the method 800 are implemented by or with refresh circuitry 214 and UBD counter clearance circuitry 120 as described with reference to FIGS. 1 to 7.

At block 802, a refresh operation is performed on a row of multiple rows of a memory array responsive to at least one refresh command. For example, the refresh circuitry 214 can perform a refresh operation on a row 406 of multiple rows 406-1 . . . 406-N of a memory array 204 responsive to at least one refresh command 408 or 702/716. For instance, self-refresh circuitry 214-1 or auto-refresh circuitry 214-2 may use a refresh command 408-1 or 408-2, respectively, to cause data contents of multiple bits 506-1 . . . 506-D of the row 406 to be returned to a "full" correct voltage level (e.g., a low voltage or a high voltage) using sense amplifiers 512. The refresh command 408 may activate a word line 502 for the row 406.

At block 804, a usage-based disturbance counter of multiple usage-based disturbance counters is cleared responsive to the at least one refresh command, with the usage-based disturbance counter configured to store a quantity of accesses to the row of the multiple rows of the memory array. For example, the UBD counter clearance circuitry 120 can clear a usage-based disturbance counter 124 of multiple usage-based disturbance counters 124-1 . . . 124-N responsive to the at least one refresh command 408 or 702/716. Here, the usage-based disturbance counter 124 can be configured to store a quantity of accesses to the row 406 of the multiple rows 406-1 . . . 406-N of the memory array 204. To perform a clearance operation, the UBD counter clearance circuitry 120 may cause a write driver 510 to write a given value (e.g., all zeros) into multiple bits 504-1 . . . 504-C of the UBD counter 124. In some cases, the UBD counter 124 may be coupled to the same word line 502 as is the row 406.

In some aspects, the UBD counter clearance circuitry 120 can cease clearance operations for the multiple usage-based disturbance counters 124-1 . . . 124-N during a self-refresh mode 730. Further, the self-refresh refresh circuitry 214-1 can continue to refresh the multiple rows 406-1 . . . 406-N of the memory array 204 during the self-refresh mode 730 after the ceasing of the counter clearances.

FIG. 9 illustrates a flow diagram 900, which includes operations 902 through 910. In aspects, operations of the method 900 are implemented by or with refresh circuitry 214 and UBD counter clearance circuitry 120 as described with reference to FIGS. 1 to 7. In some implementations, a memory device 108 includes a memory array 204 having multiple rows 406-1 . . . 406-N. The memory device 108 also includes multiple usage-based disturbance counters 124-1 . . . 124-N respectively corresponding to the multiple rows 406-1 . . . 406-N of the memory array 204.

At block 902, a self-refresh mode is entered. For example, the memory device 108 can enter a self-refresh mode 730. For instance, the memory device 108 may enter the self-refresh mode 730 in response to receiving a self-refresh entry (SR Entry) command 706 from a host device 102.

At block 904, the multiple rows can be refreshed responsive to entry into the self-refresh mode. For example, a self-refresh circuitry 214-1 portion of the refresh circuitry 214 can refresh the multiple rows 406-1 . . . 406-N responsive to entry into the self-refresh mode 730. In some cases, the self-refresh circuitry 214-1 may issue multiple instances of an internal refresh command 408-1 in accordance with an internal timing mechanism.

At block 906, the multiple usage-based disturbance counters are cleared based on refreshment of the multiple rows. For example, the UBD counter clearance circuitry 120 can clear the multiple usage-based disturbance counters 124-1 . . . 124-N based on refreshment of the multiple rows 406-1 . . . 406-N. To do so, the UBD counter clearance circuitry 120 may perform multiple clearance operations at 708 of multiple UBD counters 124-1 . . . 124-N that respectively correspond to multiple rows 406-1 . . . 406-N.

At block 908, the clearing of the multiple usage-based disturbance counters is ceased during the self-refresh mode. For example, the UBD counter clearance circuitry 120 can cease clearing the multiple usage-based disturbance counters 124-1 . . . 124-N during the self-refresh mode 730. The UBD counter clearance circuitry 120 may, for instance, cease performing clearance operations as indicated at 710 after at least one refresh cycle through each relevant memory row 406. This may be performed by the UBD counter clearance circuitry 120 using a timer, a refresh address counter 514, a refresh address cycle buffer 516, some combination thereof, and so forth as described herein.

At block 910, after cessation of the clearing of the multiple usage-based disturbance counters, at least one row of the multiple rows is refreshed before exiting the self-refresh mode with at least one usage-based disturbance counter corresponding to the at least one row remaining unchanged. For example, after cessation of the clearing of the multiple usage-based disturbance counters 124-1 . . . 124-N during the self-refresh mode 730, the self-refresh refresh circuitry 214-1 can refresh at least one row 406 of the multiple rows 406-1 . . . 406-N before exiting the self-refresh mode 730 with at least one usage-based disturbance counter 124 corresponding to the at least one row 406 remaining unchanged. Thus, as the self-refresh circuitry 214-1 refreshes a row 406 (e.g., having an address "Y"), the UBD counter clearance circuitry 120 may decline to perform a clearance operation on the corresponding UBD counter 124 as indicated at 712. After receipt of a self-refresh exit (SR Exit) command 714, an auto-refresh circuitry 214-2 portion of the refresh circuitry 214 may take control of the refresh process, and the UBD counter clearance circuitry 120 may resume clearing UBD counters as indicated at 718.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 7, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of usage-based disturbance counter clearance are described:

Example 1: An apparatus comprising:

a memory device comprising:

a memory array comprising multiple rows;

multiple usage-based disturbance counters associated with the memory array; and logic coupled to the memory array and the multiple usage-based disturbance counters, the logic configured to:

perform a refresh operation on a row of the multiple rows responsive to at least one refresh command; and clear a usage-based disturbance counter of the multiple usage-based disturbance counters responsive to the at least one refresh command, the usage-based disturbance counter configured to store a quantity of accesses to the row of the multiple rows.

Example 2: The apparatus of example 1 or any other example, wherein:

each respective usage-based disturbance counter of the multiple usage-based disturbance counters corresponds to a respective row of the multiple rows of the memory array.

Example 3: The apparatus of example 2 or any other example, wherein:

the multiple usage-based disturbance counters are integrated with the memory array.

Example 4: The apparatus of example 3 or any other example, wherein:

the memory array comprises multiple word lines; and each respective usage-based disturbance counter of the multiple usage-based disturbance counters and each respective row of the multiple rows is coupled to a respective word line of the multiple word lines.

Example 5: The apparatus of example 1 or any other example, wherein:

the refresh operation comprises a self-refresh operation; and the logic is further configured to generate the at least one refresh command internal to the memory device.

Example 6: The apparatus of example 1 or any other example, wherein:

the refresh operation comprises an auto-refresh operation; and the logic is further configured to receive the at least one refresh command from a source that is external to the memory device.

Example 7: The apparatus of example 1 or any other example, wherein the logic is configured to clear the usage-based disturbance counter responsive to the at least one refresh command by:

writing a known value into the usage-based disturbance counter.

Example 8: The apparatus of example 7 or any other example, wherein the logic is further configured to clear the usage-based disturbance counter responsive to the at least one refresh command by:

writing a zero ("0") into each bit of multiple bits of the usage-based disturbance counter.

Example 9: The apparatus of example 1 or any other example, wherein the logic is further configured to:

perform the refresh operation on two or more rows of the multiple rows responsive to the at least one refresh command; and clear two or more usage-based disturbance counters of the multiple usage-based disturbance counters responsive to the at least one refresh command, each respective usage-based disturbance counter of the two or more usage-based disturbance counters configured to store a respective quantity of accesses to a respective row of the two or more rows.

Example 10: The apparatus of example 9 or any other example, wherein:

the memory device further comprises at least one write driver; and the at least one write driver is configured to clear substantially simultaneously the two or more usage-based disturbance counters of the multiple usage-based disturbance counters responsive to the at least one refresh command.

Example 11: The apparatus of example 1 or any other example, wherein the logic is further configured to:

enter a self-refresh mode;

refresh each row of the multiple rows responsive to entry into the self-refresh mode;

clear each usage-based disturbance counter of the multiple usage-based disturbance counters based on refreshing each corresponding row of the multiple rows; and cease clearing the multiple usage-based disturbance counters during the self-refresh mode.

Example 12: The apparatus of example 11 or any other example, wherein the logic is further configured to:

refresh at least one row of the multiple rows while in the self-refresh mode after cessation of the clearing of the multiple usage-based disturbance counters during the self-refresh mode.

Example 13: The apparatus of example 12 or any other example, wherein the logic is further configured to:

clear each usage-based disturbance counter corresponding to all rows of the memory array being operated in the self-refresh mode at least once before the cessation of the clearing of the multiple usage-based disturbance counters during the self-refresh mode.

Example 14: The apparatus of example 11 or any other example, wherein:

the memory device further comprises a refresh address counter configured to store an address of a row targeted for a refresh operation; and the logic is further configured to cease clearing the multiple usage-based disturbance counters during the self-refresh mode based on the refresh address counter.

Example 15: The apparatus of example 14 or any other example, wherein the logic is further configured to:

cease clearing the multiple usage-based disturbance counters during the self-refresh mode based on the refresh address counter repeating an address value of a row.

Example 16: The apparatus of example 14 or any other example, wherein:

the memory device further comprises a buffer configured to store an address indicative that a refresh cycle has been completed through each of the multiple rows of the memory array that is subject to the self-refresh mode; and the logic is further configured to cease clearing the multiple usage-based disturbance counters during the self-refresh mode based on the address stored in the buffer and the refresh address counter.

Example 17: The apparatus of example 1 or any other example, wherein the apparatus comprises a Compute Express Link™ (CXL™) device.

Example 18: A method comprising:

performing a refresh operation on a row of multiple rows of a memory array responsive to at least one refresh command; and clearing a usage-based disturbance counter of multiple usage-based disturbance counters responsive to the at least one refresh command, the usage-based disturbance counter configured to store a quantity of accesses to the row of the multiple rows of the memory array.

Example 19: The method of example 18 or any other example, further comprising:

ceasing clearance of the multiple usage-based disturbance counters during a self-refresh mode; and continuing to refresh the multiple rows of the memory array during the self-refresh mode after the ceasing.

Example 20: An apparatus comprising:

a memory device comprising:

a memory array comprising multiple rows; and multiple usage-based disturbance counters respectively corresponding to the multiple rows of the memory array, the memory device configured to:

enter a self-refresh mode;

refresh the multiple rows responsive to entry into the self-refresh mode;

clear the multiple usage-based disturbance counters based on refreshment of the multiple rows;

cease clearing the multiple usage-based disturbance counters during the self-refresh mode; and after cessation of the clearing of the multiple usage-based disturbance counters, refresh at least one row of the multiple rows before exiting the self-refresh mode with at least one usage-based disturbance counter corresponding to the at least one row remaining unchanged.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of implementing usage-based disturbance counter clearance have been described in language specific to certain features and/or methods, the subject of the appended claims is not necessarily limited to the specific features or methods described. Rather, the specific features and methods are disclosed as a variety of example implementations for usage-based disturbance counter clearance.

What is claimed is:

1. An apparatus comprising:

a memory device comprising:

a memory array comprising multiple rows;

multiple usage-based disturbance counters associated with the memory array; and logic coupled to the memory array and the multiple usage-based disturbance counters, the logic configured to:

enter a self-refresh mode;

perform a refresh operation on a row of the multiple rows responsive to at least one refresh command while in the self-refresh mode;

clear a usage-based disturbance counter of the multiple usage-based disturbance counters responsive to the at least one refresh command, the usage-based disturbance counter configured to store a quantity of accesses to the row of the multiple rows;

refresh each row of the multiple rows responsive to entry into the self-refresh mode;

clear each usage-based disturbance counter of the multiple usage-based disturbance counters based on performing a refresh operation on each corresponding row of the multiple rows;

cease clearing the multiple usage-based disturbance counters during the self-refresh mode; and refresh at least one row of the multiple rows while in the self-refresh mode without clearing the corresponding at least one usage-based disturbance counter after the cessation of the clearing of the multiple usage-based disturbance counters during the self-refresh mode.

2. The apparatus of claim 1, wherein:

each respective usage-based disturbance counter of the multiple usage-based disturbance counters corresponds to a respective row of the multiple rows of the memory array.

3. The apparatus of claim 2, wherein:

the multiple usage-based disturbance counters are integrated with the memory array.

4. The apparatus of claim 3, wherein:

the memory array comprises multiple word lines; and each respective usage-based disturbance counter of the multiple usage-based disturbance counters and each respective row of the multiple rows is coupled to a respective word line of the multiple word lines.

5. The apparatus of claim 1, wherein:

the refresh operation comprises a self-refresh operation; and the logic is further configured to generate the at least one refresh command internal to the memory device.

6. The apparatus of claim 1, wherein:

the memory device comprises a memory module;

the memory module comprises multiple memory dies; and the memory array comprises part of at least one memory die of the multiple memory dies.

7. The apparatus of claim 1, wherein the logic is configured to clear the usage-based disturbance counter responsive to the at least one refresh command by:

writing a known value into the usage-based disturbance counter.

8. The apparatus of claim 7, wherein the logic is further configured to clear the usage-based disturbance counter responsive to the at least one refresh command by:

writing a zero ("0") into each bit of multiple bits of the usage-based disturbance counter.

9. The apparatus of claim 1, wherein the logic is further configured to:

perform the refresh operation on two or more rows of the multiple rows responsive to the at least one refresh command; and clear two or more usage-based disturbance counters of the multiple usage-based disturbance counters responsive to the at least one refresh command, each respective usage-based disturbance counter of the two or more usage-based disturbance counters configured to store a respective quantity of accesses to a respective row of the two or more rows.

10. The apparatus of claim 9, wherein:

the memory device further comprises at least one write driver; and the at least one write driver is configured to clear substantially simultaneously the two or more usage-based disturbance counters of the multiple usage-based disturbance counters responsive to the at least one refresh command.

11. The apparatus of claim 1, wherein the logic is further configured to:

exit the self-refresh mode; and based on the exit from the self-refresh mode, restart clearing of the multiple usage-based disturbance counters corresponding to the multiple rows responsive to refresh operations being performed on the multiple rows.

12. The apparatus of claim 1, wherein the logic is further configured to:

clear each usage-based disturbance counter corresponding to all rows of the memory array being operated in the self-refresh mode at least once before the cessation of the clearing of the multiple usage-based disturbance counters during the self-refresh mode.

13. The apparatus of claim 1, wherein:

the memory device further comprises a refresh address counter configured to store an address of a row targeted for a refresh operation; and the logic is further configured to cease clearing the multiple usage-based disturbance counters during the self-refresh mode based on the refresh address counter.

14. The apparatus of claim 13, wherein the logic is further configured to:

cease clearing the multiple usage-based disturbance counters during the self-refresh mode based on the refresh address counter repeating an address value of a row of the multiple rows of the memory array.

15. The apparatus of claim 13, wherein:

the memory device further comprises a buffer configured to store an address indicative that a refresh cycle has been completed through each of the multiple rows of the memory array that is subject to the self-refresh mode; and the logic is further configured to cease clearing the multiple usage-based disturbance counters during the self-refresh mode based on the address stored in the buffer and the address stored in the refresh address counter.

16. The apparatus of claim 15, wherein:

the address indicative that a refresh cycle has been completed as stored in the buffer corresponds to a starting refresh address upon entry into the self-refresh mode.

17. The apparatus of claim 1, wherein the apparatus comprises a Compute Express Link™ (CXL™) device.

18. A method comprising:

entering a self-refresh mode;

performing a refresh operation on a row of multiple rows of a memory array responsive to at least one refresh command while in the self-refresh mode;

clearing a usage-based disturbance counter of multiple usage-based disturbance counters responsive to the at least one refresh command, the usage-based disturbance counter configured to store a quantity of accesses to the row of the multiple rows of the memory array;

refreshing each row of the multiple rows responsive to the entering of the self-refresh mode;

clearing each usage-based disturbance counter of the multiple usage-based disturbance counters based on the refreshing of each row of the multiple rows;

ceasing the clearing of the multiple usage-based disturbance counters during the self-refresh mode; and refreshing at least one row of the multiple rows while in the self-refresh mode without clearing the corresponding at least one usage-based disturbance counter after the ceasing of the clearing of the multiple usage-based disturbance counters during the self-refresh mode.

19. The method of claim 18, further comprising:

continuing to refresh the multiple rows of the memory array during the self-refresh mode after the ceasing of the clearing;

exiting the self-refresh mode; and based on the exiting of the self-refresh mode, restarting the clearing of the multiple usage-based disturbance counters corresponding to the multiple rows of the memory array responsive to refresh operations being performed on the multiple rows.

20. The method of claim 18, wherein the ceasing of the clearing comprises:

ceasing the clearing of the multiple usage-based disturbance counters across multiple refresh operations during the self-refresh mode after each usage-based disturbance counter of the multiple usage-based disturbance counters has been cleared at least once since the entering of the self-refresh mode.

* * * * *